US 8,627,564 B2
Jan. 14, 2014

(12) United States Patent
Blossfeld et al.

(54) ELECTRONIC ASSEMBLY AND METHOD OF MANUFACTURING SAME

(75) Inventors: Mike Blossfeld, South Lyon, MI (US);
Luis Fernando Sanchez, Commerce Township, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 457 days.

(21) Appl. No.: 12/808,860

(22) PCT Filed: Dec. 18, 2008

(86) PCT No.: PCT/US2008/087467
§ 371 (c)(1),
(2), (4) Date: Jun. 17, 2010

(87) PCT Pub. No.: WO2009/085975
PCT Pub. Date: Jul. 9, 2009

(65) Prior Publication Data
US 2011/0170269 A1    Jul. 14, 2011

Related U.S. Application Data

(60) Provisional application No. 61/008,393, filed on Dec. 20, 2007.

(51) Int. Cl.
*H01R 43/00* (2006.01)

(52) U.S. Cl.
USPC ............. 29/883; 29/592.1; 29/884; 361/752; 361/759; 361/747; 439/79; 439/80; 439/84; 439/620.12; 439/620.23

(58) Field of Classification Search
USPC ......... 29/883, 592.1, 884; 361/752, 759, 747; 439/79, 80, 84, 620.12, 620.17, 439/620.18, 620.23
See application file for complete search history.

(56) References Cited

U.S. PATENT DOCUMENTS

| | | | |
|---|---|---|---|
| 4,996,492 A | 2/1991 | Anderson et al. | |
| 5,382,898 A | 1/1995 | Subramanian | |
| 5,608,611 A * | 3/1997 | Szudarek et al. | ............. 361/753 |
| 5,707,249 A | 1/1998 | Byrd | |
| 6,007,371 A | 12/1999 | Hickox | |
| 6,093,061 A | 7/2000 | Varsik et al. | |
| 6,163,460 A | 12/2000 | Baur et al. | |
| 6,273,762 B1 | 8/2001 | Regnier | |
| 6,276,944 B1 | 8/2001 | Klatt | |
| 6,300,564 B1 | 10/2001 | Moraes et al. | |
| 6,459,042 B1 | 10/2002 | Stilianos et al. | |
| 6,600,658 B2 | 7/2003 | Iwata | |
| 6,624,354 B1 | 9/2003 | Martinez | |
| 6,652,292 B2 | 11/2003 | Pratt et al. | |

(Continued)

*Primary Examiner* — Peter DungBa Vo
*Assistant Examiner* — Azm Parvez
(74) *Attorney, Agent, or Firm* — Tarolli, Sundheim, Covell & Tummino LLP

(57) ABSTRACT

An electronic assembly comprises a housing, a cover for the housing, a printed circuit board receivable in the housing, and a compliant pin header assembly. The compliant pin header assembly is moimtabie in the housing by inter-engaging features on the header assembly and the housing. The compliant pin header assembly has compliant pins for engaging corresponding features on the printed circuit board to connect the compliant pin header assembly electrically to the printed circuit board. The cover, when the electronic assembly is assembled, engages the housing and also engages the printed circuit board at a location spaced from an outer periphery of the printed circuit board.

6 Claims, 13 Drawing Sheets

(56) References Cited

U.S. PATENT DOCUMENTS

| | | |
|---|---|---|
| 6,728,110 B2 | 4/2004 | Koyama |
| 6,773,272 B2 * | 8/2004 | Koehler et al. ............. 439/79 |
| 6,870,097 B2 | 3/2005 | Oda |
| 6,930,248 B1 | 8/2005 | Saka et al. |
| 6,943,292 B2 | 9/2005 | Dingman |
| 7,078,620 B2 | 7/2006 | Ikeda et al. |
| 7,195,519 B1 | 3/2007 | McAlonis et al. |
| 2001/0017766 A1 | 8/2001 | Murowaki et al. |
| 2002/0149918 A1 | 10/2002 | Koyama |
| 2004/0141295 A1 | 7/2004 | Fischer et al. |

* cited by examiner

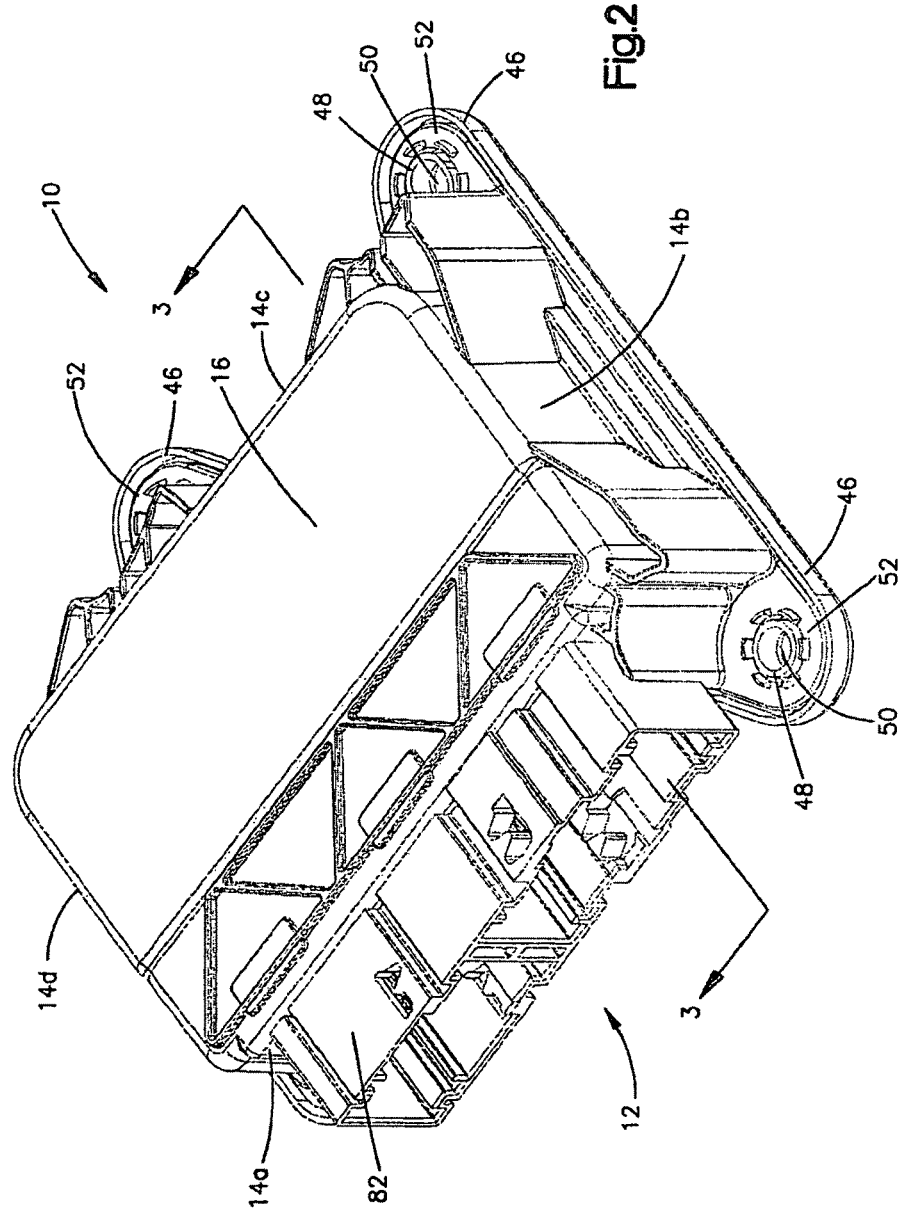

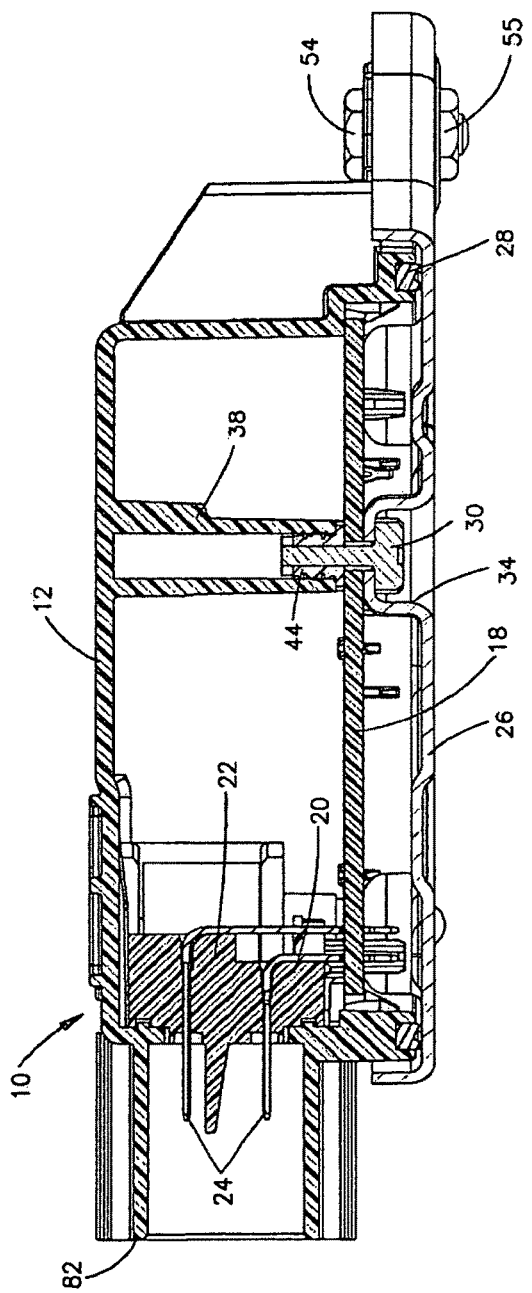

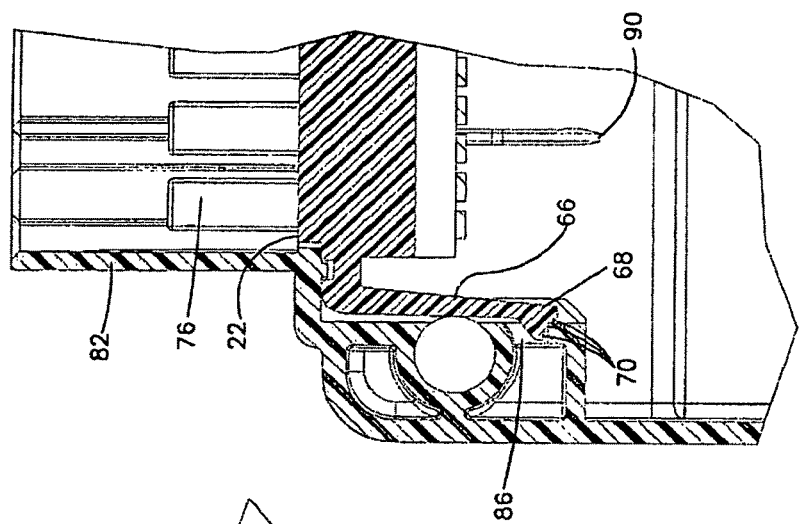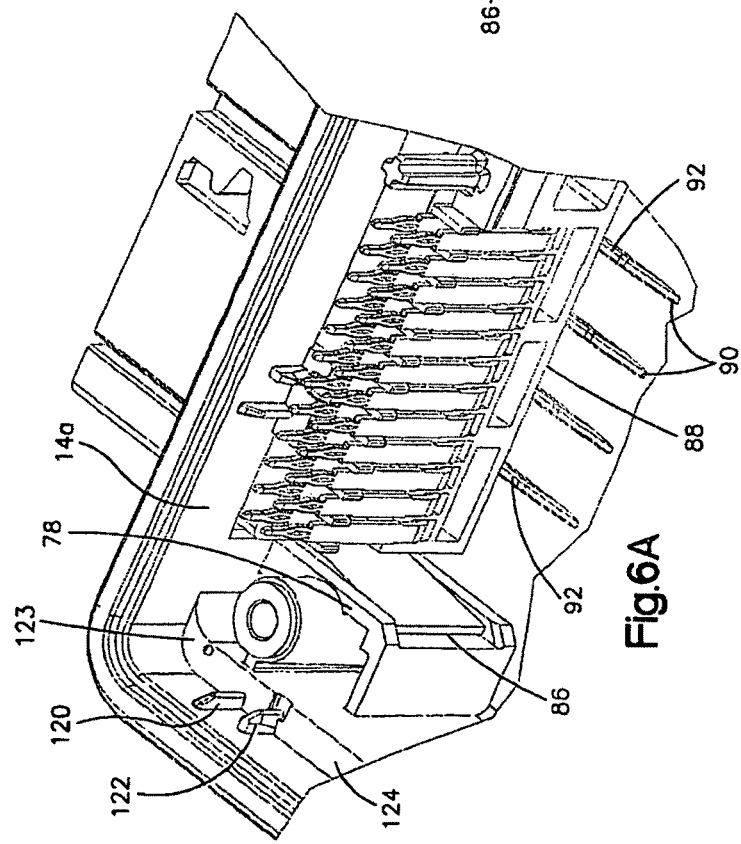

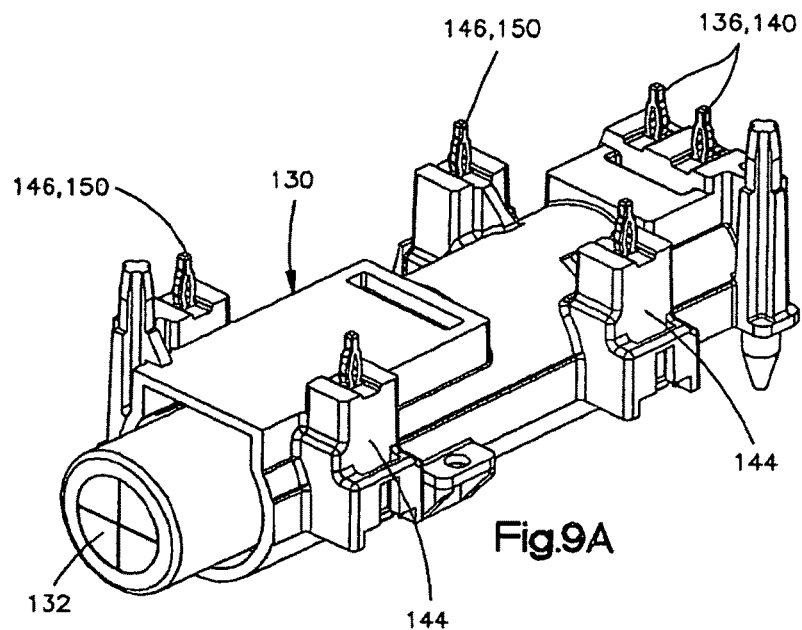
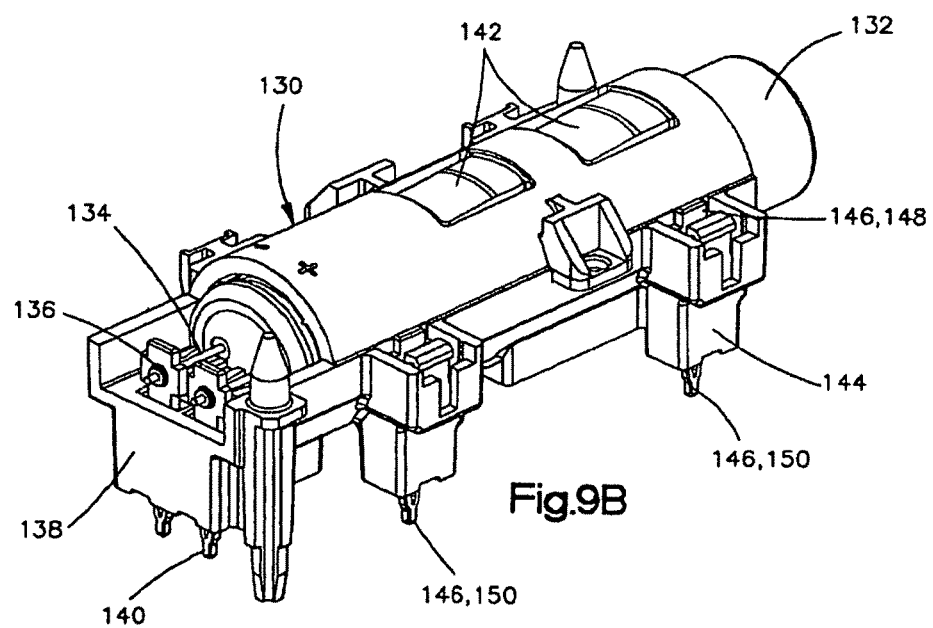

ELECTRONIC ASSEMBLY AND METHOD OF MANUFACTURING SAME

RELATED APPLICATIONS

This application claims priority from U.S. Provisional Application No. 61/008,393, filed Dec. 20, 2007.

TECHNICAL FIELD

The present invention relates to an electronic assembly and a method of manufacturing the electronic assembly and, more particularly, to an electronic assembly that includes a printed circuit board and a method of manufacturing such an electronic assembly.

BACKGROUND OF THE INVENTION

It is known to provide an enclosure for an electronic assembly that includes a printed circuit board and a connector. For example, electronic modules and sensors for automotive applications often include a multi-piece (e.g., housing and cover) enclosure for their electronic components, together with a connector that is mounted on a printed circuit board ("PCB"). Because the connector is mounted on the PCB, difficulties may arise in achieving desired alignment between the connector for the electronic assembly and an external, mating connector, which together electrically connect the electronic assembly to other portions of the vehicle circuitry.

An alternative approach is to use an electronic assembly that includes a plastic enclosure with insert molded connector terminals. Such an enclosure with insert molded connector terminals is expensive as it requires unique tooling and assembly equipment for each particular vehicle application.

SUMMARY OF THE INVENTION

The present invention is directed to an electronic assembly and a method of manufacturing the electronic assembly and, more particularly, to an electronic assembly that includes a printed circuit board and a method of manufacturing such an electronic assembly.

In accordance with one example embodiment of the present invention, an electronic assembly comprises a housing, a cover for the housing, a printed circuit board receivable in the housing, and a compliant pin header assembly. The compliant pin header assembly is mountable in the housing by inter-engaging features on the header assembly and the housing. The compliant pin header assembly has compliant pins for engaging corresponding features on the printed circuit board to connect the compliant pin header assembly electrically to the printed circuit board. When assembled, the cover engages the housing and also engages the printed circuit board at a location spaced from an outer periphery of the printed circuit board.

In accordance with another example embodiment of the present invention, an electronic assembly comprises a housing, a printed circuit board receivable in the lousing, and a compliant pin header assembly. The compliant pin header assembly includes (a) a header with passages formed to receive compliant pins and (b) electrically conductive compliant pins receivable in the passages of the header. The compliant pin header assembly is mountable in the housing with the compliant pins engageable with and electrically connectable to the printed circuit board. Each passage of the header is at least partially defined by a substantially flat datum surface and an opposed passage surface. Each compliant pin is receivable in a corresponding one of said passages and has a substantially flat pin surface for engaging the datum surface of the corresponding passage and also has an opposed pin surface. The opposed pin surface includes a raised portion for engaging the opposed passage surface of the corresponding passage and thereby pressing the substantially flat pin surface of the compliant pin against the datum surface of the corresponding passage when said compliant pin is received in the corresponding passage.

In accordance with a further example embodiment of the present invention, an enclosure for a printed circuit board comprises a housing with at least one projection formed on an interior surface of the housing to engage and support the printed circuit board. The at least one projection has a flat surface for receiving and supporting the printed circuit board and an adjacent angled surface. The angled surface helps to position the printed circuit board on the flat surface.

In accordance with still a further example embodiment of the present invention, a method is provided for assembling an electronic device. The method comprises the steps of inserting a compliant pin into a header to form a compliant pin header assembly and engaging the compliant pin header assembly with a housing so that a first end of the compliant pin is presented outwardly of the housing and a second end of the compliant pin is disposed within the housing. The method also comprises the steps of placing a printed circuit board within the housing so that the printed circuit board engages the second end of the compliant pin and placing a cover on the housing so that the cover engages the housing and also engages the printed circuit board at a location spaced from an outer periphery of the printed circuit board.

In accordance with yet a further example embodiment of the present invention, a method is provided for assembling an electronic device. The method comprises the step of molding a header from a plastic header material to form passages in the header to receive a plurality of compliant pins. Each passage of the header is at least partially defined by a substantially flat datum surface and an opposed passage surface. The method also comprises the step of forming each of the compliant pins from electrically conductive material to have a substantially flat pin surface and an opposed pin surface that includes a raised portion. The method further comprises the step of inserting each compliant pin into a corresponding passage of the header to form a compliant pin header assembly. The raised portion of the opposed pin surface of the compliant pin engages the opposed passage surface of the corresponding passage and thereby presses the substantially flat pin surface of the compliant pin against the datum surface of the corresponding passage. The method still further comprises the steps of engaging the compliant, pin header assembly with a housing so that a first end of each compliant pin is presented outwardly of the housing and a second end of each compliant pin is disposed within the housing and placing a printed circuit board within the housing so that the printed circuit board engages the second end of each compliant pin.

In accordance with still a further example embodiment of the present invention, a method is provided for manufacturing different electronic devices using common equipment. The method comprises the step of forming a first compliant pin header assembly that includes a first header and a first plurality of compliant pins. The method also comprises step of engaging the first compliant pin header assembly With a first housing using a common header-to-housing assembly machine so that a first end of each compliant pin of the first plurality of compliant pins is presented outwardly of the first housing and a second end of each compliant pin of the first plurality of compliant pins is disposed within the first housing. The method further comprises the step of placing a first printed circuit board within the first housing using a common board-to-housing assembly machine so that the first printed circuit board engages the second end of each compliant pin of the first plurality of compliant pins. The method yet further comprises the step of forming a second compliant pin header assembly that includes a second header and a second plurality of compliant pins. The method still further comprises the step of engaging the second compliant pin header assembly with a second housing using the common header-to-housing assembly machine so that a first end of each compliant pin of the second plurality of compliant pins is presented outwardly of the second housing and a second end of each compliant pin of the second plurality of compliant pins is disposed within the second housing. The second housing has a different housing characteristic than the first housing. The method further yet comprises the step of placing second printed circuit board within the second housing using the common board-to-housing assembly machine so that the second printed circuit board engages the second end of each compliant pin of the second plurality of compliant pins. The second printed circuit board has a different circuit board characteristic than the first printed circuit board.

BRIEF DESCRIPTION OF THE DRAWINGS

The foregoing and other features and advantages of the present invention will become apparent to those skilled in the art to which the present invention relates upon reading the following description with reference to the accompanying drawings, in which:

FIG. 2 is a perspective view of the electronic assembly of FIG. 1;

FIG. 3 is a sectional view taken along line 3-3 of FIG. 2;

FIG. 5C is an enlarged perspective view of a portion of the housing of FIG. 5A;

FIGS. 6A and 6B are enlarged views of portions of the header assembly of FIG. 4A installed in the housing of FIG. 5A;

FIG. 9A is an enlarged top perspective view of a capacitor carrier installed in the housing of the electronic assembly of FIG. 1;

FIGS. 9B is an enlarged bottom perspective view, of the capacitor carrier of FIG. 9A.

DETAILED DESCRIPTION

Figure 1:
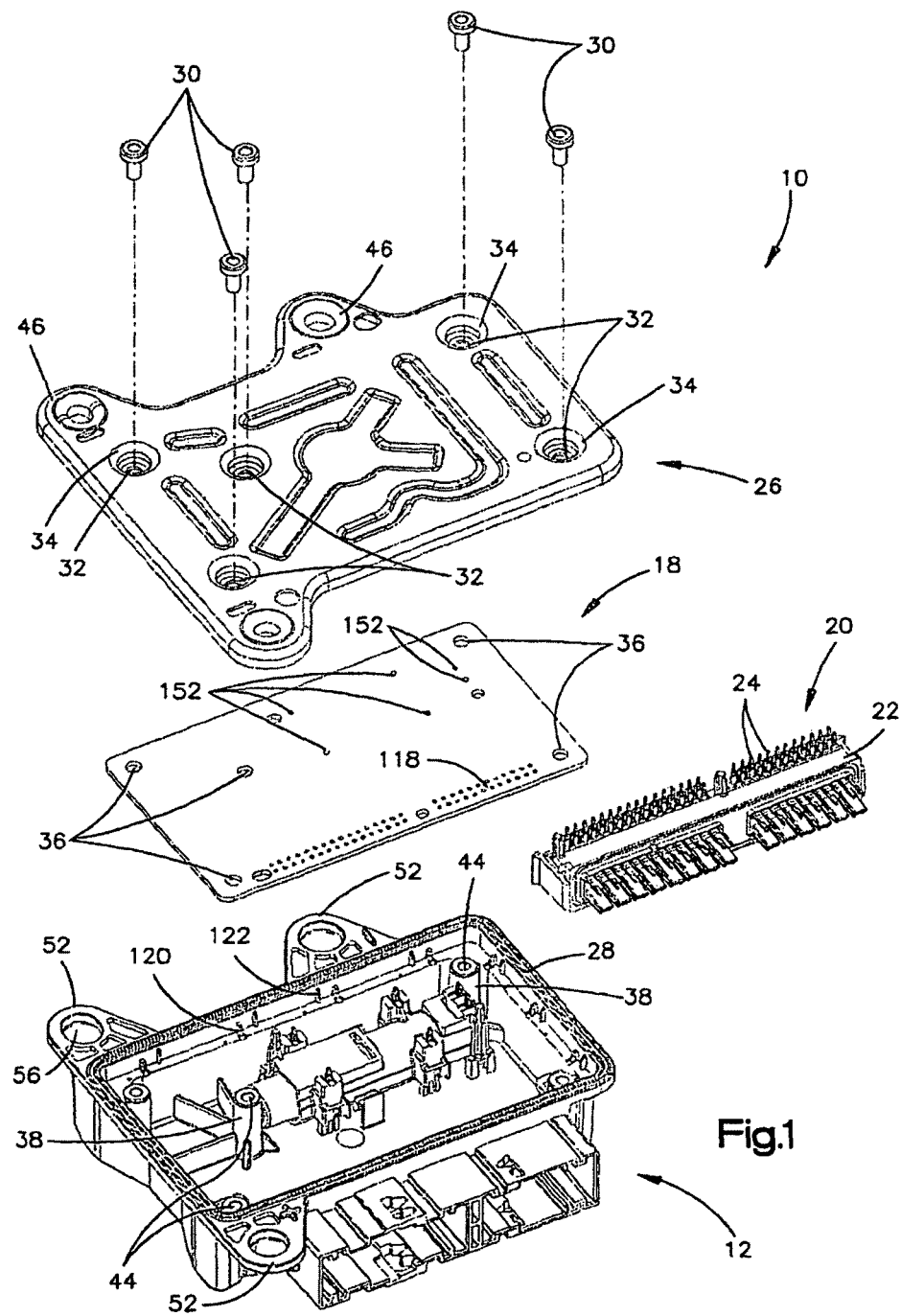
FIG. 1 is an exploded perspective view of a first example embodiment of an electronic assembly constructed in accordance with the present invention.

Referring to FIGS. 1 through 3, an electronic assembly 10 in accordance with an example embodiment of the present invention is shown. The electronic assembly 10 includes a plastic housing 12. The plastic housing 12 is a one-piece molded unit with four housing side walls 14a-14d and a top 16 and may be lighter in weight than a comparably sized metal housing. The plastic housing 12 receives a printed circuit board ("PCB") 18 and a separate compliant pin header assembly 20. The compliant pin header assembly 20 is snapped in place in the housing. The PCB 18 is pressed onto the compliant pin header assembly 20, as will be described in greater detail below. The compliant pin header assembly 20 includes a compliant pin header 22 and two rows of compliant pins or terminals 24. The compliant pin header 22 is a molded plastic part, and the compliant pins or terminals 24 may be "stitched into" the pin header, rather than being insert molded in the Pin header. A portion of the compliant pin header assembly 20 is exposed to the exterior of the housing 12 and may be engaged by amating harness connector (not shown), which is connected to circuitry in a vehicle (not shown) or to other external circuitry. A metal cover 26 without a conformal coating closes the open bottom of the housing 12. An O-ring seal 28 may be provided between the cover 26 and the housing 12 to help seal the electronic assembly 10.

The metal cover 26 is secured to the housing 12 by metal screws 30 that extend through openings 32 formed in depressions 34 in the cover. The metal screws 30 also extend through openings 36 in the PCB 18. Posts 38, which extend away from the top 16 of the housing 12 toward the metal cover 26, are aligned with the openings 32 and 36. Metal inserts 44 with threaded central openings are mounted, via a press fit, for example, in the ends of the posts 38 adjacent the PCB 18. The threaded ends of the metal screws 30 are screwed into the threaded central openings in the metal inserts 44 to help secure the metal cover 26 to the plastic housing 12. The screws 30 and the metal inserts 44 also help to hold the PCB 18 in the housing 12 both by having the cover clamped against the PCB and by the engagement between the screws and the metal inserts.

A ground connection to the body of a vehicle (not shown) may be provided through the metal cover 26 by the metal screws 30 and the threaded metal inserts 44. Specifically, when the metal screws 30 are screwed into and tightened in the threaded metal inserts 44, the inserts may engage electrically-conductive portions (not shown) of the PCB 18. This provides a ground path from the electrically-conductive portions of the PCB 18 through the threaded metal inserts 44 and the metal screws 30 to the metal cover 26. As will be explained below, the metal cover 26 may, in turn, be grounded to the vehicle body (not shown).

To help mount the electronic assembly 10 to the vehicle body (not shown), the metal cover 26 includes three lugs or ears 46. The lugs 46 are formed in one piece with remainder of the metal cover 26 and project laterally outward at spaced apart locations around the periphery of the cover. Each lug 46 includes a relatively short, tubular sleeve 48 that is formed in one piece from the material of the lug, for example, by stamping. The sleeve 48 defines a central opening 50 in the lug. Corresponding to the three lugs 46 on the cover 26 are three lugs 52 formed in one piece with and spaced apart around the periphery of the housing 12. Each lug 52 includes a central opening 56 that receives the tubular sleeve 48 of a corresponding lug 46 of the cover 26.

To secure the electronic assembly 10 to the vehicle body (not shown), a metal fastener 54, such as a bolt, (FIG. 3) is inserted into the tubular sleeve 48 of each of the lugs 46 of the cover 26 for the electronic assembly. The metal fastener 54 extends through the tubular sleeve 48 and projects from the end of the sleeve a distance sufficient to allow the bolt to pass through a portion of the vehicle body (not shown). A second fastener element 55 (FIG. 3), such as a metal nut, is attached to the end of the metal fastener 54 and tightened to secure the metal fastener to the vehicle body and thereby also provide a electrical ground path from the metal cover 26 through the metal fastener to the vehicle body.

Each tubular sleeve 48 of the metal cover 26 has a length selected to limit the compression load that may be applied to the corresponding lug 52 of the plastic housing 12 by tightening the second fastener element 55, such as a nut, on the metal fastener 54 when it extends through the sleeve. Specifically, each tubular sleeve 48 of the cover 26 may have a length greater than, equal to, or less than the thickness of the corresponding lug 52 of the housing 12. If the length of tubular sleeve 48 is less than the thickness of the corresponding lug 52 of the housing 12, the difference between the length of the tubular sleeve and the thickness of the lug will help to determine the extent to which the plastic material of the lug may be compressed.

In accordance with an alternative example embodiment of the electronic assembly 10, the screws 30, the openings 32, and the threaded metal inserts 44 may be eliminated. In such an alternative embodiment, the depressions 34 are still included. The depressions 34 surround the openings 32 in the cover 26, as shown in FIG. 2, and are stamped in the cover and therefore appear as projections on the underside of the cover. The depressions or projections 34 contact the PCB 18 adjacent the openings 36 in the PCB. Electrically-conductive contacts (not shown) extend through the openings 36 and engage the depressions or projections 34 to provide aground path from the PCB 18 to the cover 26. The metal cover 26 may be grounded to the vehicle body (not shown) through the metal fasteners 54. The metal fasteners 54, when secured to the vehicle body, may also press the depressions or projections 34 against the PCB 18 both to maintain the electrically-conductive ground path and to clamp the PCB against adjacent portions of the housing 12, such as the posts 38.

As a further example embodiment of the present invention, the cover 26 may be formed of a plastic material and then coated with a conductive conformal coating. The conductive conformal coating provides a ground path for the PCB 18, which may otherwise be provided by the metal cover 26 of FIG. 1. Such a plastic cover 26 may be secured to the housing 12 by a variety of techniques, such as laser welding.

Figure 4A:
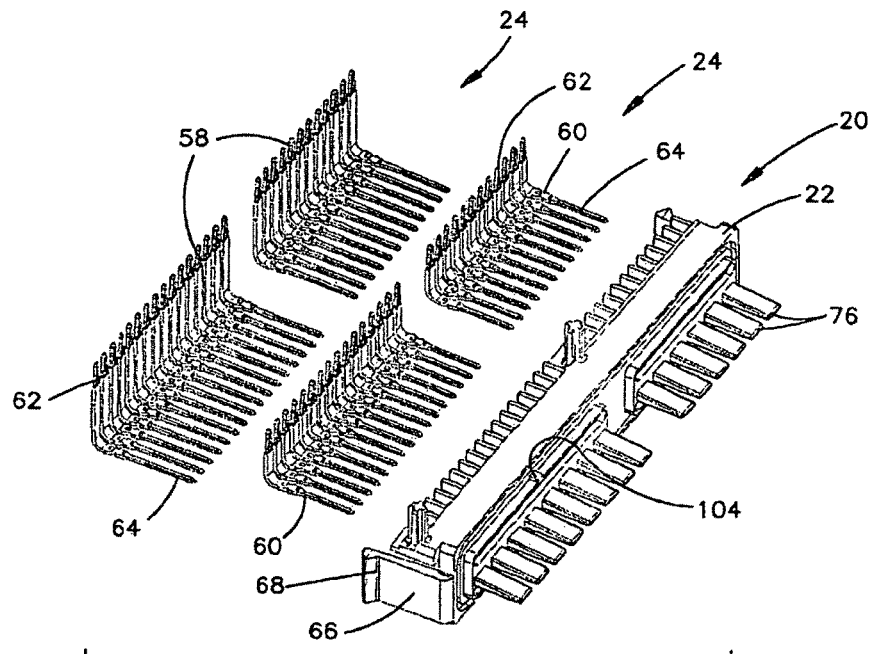
FIG. 4A is an exploded view of a header assembly for use with the electronic assembly of FIG. 1.

FIG. 4A illustrates a method, in accordance with an example embodiment of the present invention, for assembling the header assembly 20. As shown in FIG. 4A, a first row of compliant pins 24 is formed in a configuration in which adjacent pins are joined together, side-by-side, in two laterally spaced apart first "combs" 58. The compliant pins 24 of the two first combs 58, which may initially be manufactured as straight pins, are bent into L-shaped configurations and inserted into or "stitched into" the plastic header 22. Retention features 40 (FIG. 7C), such as barbs, on the compliant pins help maintain the pins securely in place in the plastic header 22. A second row of compliant pins 24 is formed in a configuration in which adjacent pins are joined together, side-by-side, in two laterally spaced apart second "combs" 60. The compliant pins 24 of the two second combs 60, which may initially be manufactured as straight pins, are bent, into L-shaped configurations and inserted into the plastic header 22 underneath and behind the compliant pins 24 of the two first combs 58. The resulting header assembly 20 includes two rows of compliant pins 24 with compliant pin legs 62 projecting upward and terminal legs 64 projecting horizontally.

Figure 5A:
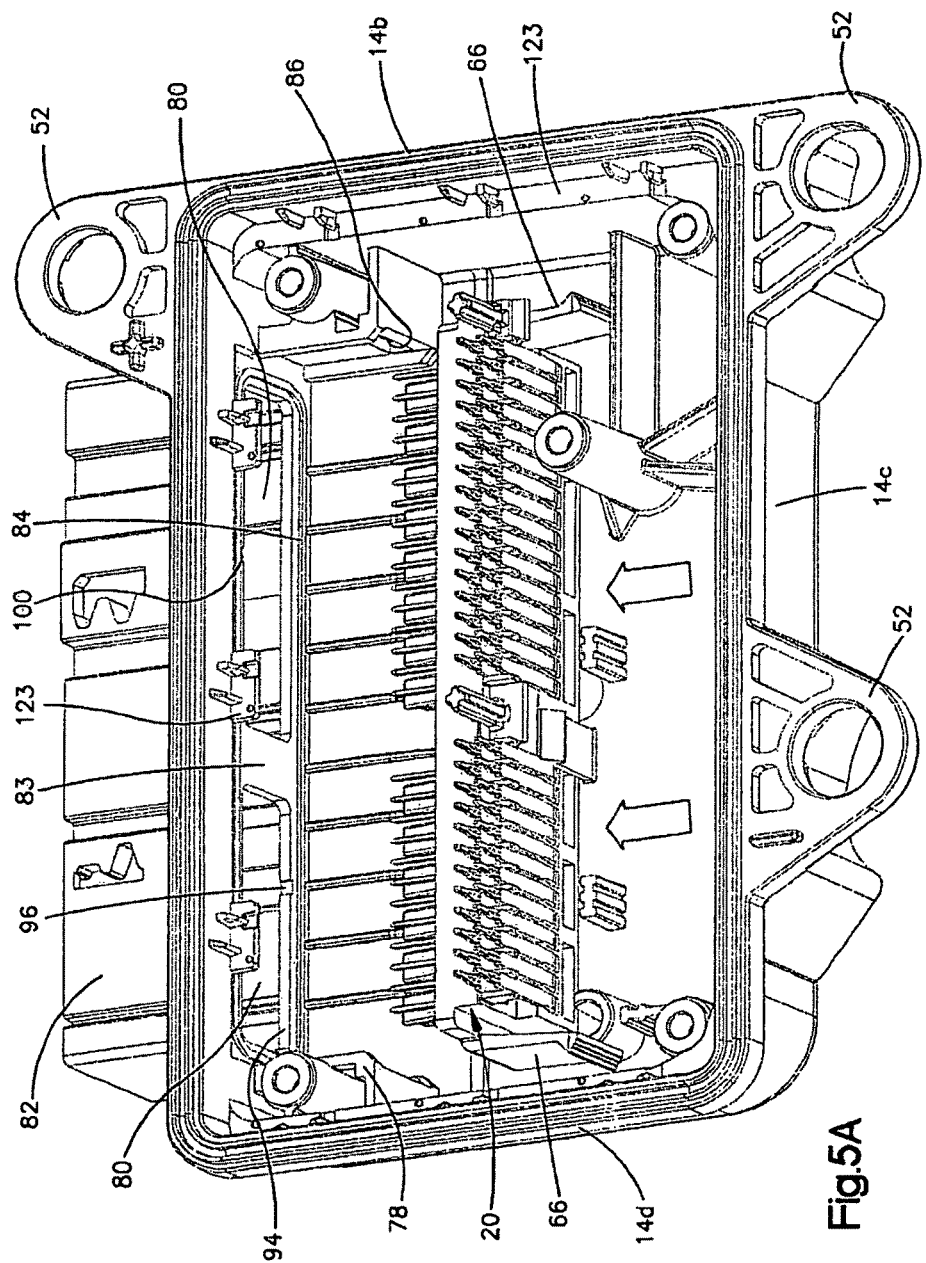
FIG. 5A is top view of a header assembly being assembled in a housing for the electronic assembly of FIG. 1.

As shown in FIG. 4A, the header 22 of the header assembly 20 includes resiliently flexible arms 66 at opposite ends of the header. Each flexible arm 66 is molded in one piece with the header 22 and has a proximal end joined to the header. The flexible arm 66 extends from its proximal end generally parallel to an adjacent surface of the header 22 but spaced from the header to art enlarged distal end 68. The enlarged distal end 68 is formed with series of serrations or projections 70 (FIGS. 5A and 6B) and enables the header 22 to be snapped into mating features in the housing 12.

Figure 4B:
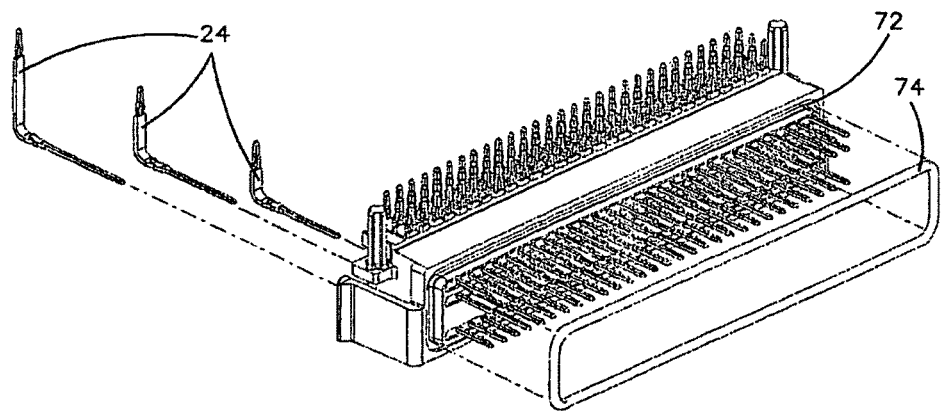
FIG. 4B is a downward looking perspective view, partially exploded, of an alternate construction of the header assembly of FIG. 4A.

Although the header assembly 20 of FIG. 4A has its compliant pins 24 arranged in two spaced-apart groups, each of which includes two rows of pins, all of the pins may alternatively be arranged in a single group, as shown in the alternate construction of FIG. 4B, depending on the configuration of the external, mating connector (not shown). Also, although the compliant pins 24 of the header assembly 20 of FIG. 4A are formed and inserted into the header 22 in first and second combs 58 and 60 of multiple compliant pins, the compliant pins may alternatively be inserted into the header individually; as shown in FIG. 4B. Further, the header 22 may be formed with more openings to receive compliant pins 24 than there are compliant pins to insert into the header. As still further shown in FIG. 4B, the header 22 may include a groove 72 that surrounds the projecting terminal legs 64 of the compliant pins 24 and that may receive a seal member 74, such as an O-ring.

As shown in FIG. 4A, the header 22 may include optional projecting shorting bars 76. The shorting bars 76 may be molded in one piece with the header and may project from the front of the header in the same direction as the terminal legs 64 of the compliant pins 24. The shorting bars 76 help to ensure that electrical connections are not inadvertently shorted across adjacent terminal legs 64 of the compliant pins 24 and may also help protect the terminal legs from being inadvertently bent or otherwise deflected from their desired orientation.

As best shown ink FIGS. 5A through 6B, the header assembly 20 is snapped in place inside the housing 12. The snap-in connection is achieved by engagement between the flexible arms 66 on the plastic header 22 and guide walls 78 projecting from, the interior surface of the top 16 of the housing 12. The flexible arms 66 and the guide walls 78 represent inter-engaging features of the header assembly 20 and the housing, respectively.

In one example embodiment of an assembly process in accordance with the present invention, the header assembly 20 is placed in the housing 12 spaced from the housing side walls 14a-14d. One housing side wall 14a is formed with two spaced apart openings 80 to receive the projecting terminal legs 64 of the compliant pins 24 and the projecting shorting bars 76. A connector shroud 82 surrounds both openings 80 and projects outwardly from the side wall 14a of the housing 12. A step 84 formed in the side wall 14a surrounds both openings 80 and is presented inwardly of the side wall toward the header assembly 20.

The header assembly 20 is oriented relative to the side wall 14a so that the projecting terminal legs 64 of the compliant pins 24 and the projecting shorting bars 76 are aligned with the openings 80. The header assembly 20 is then pressed in a direction toward the side wall 14a of the housing 12, as indicated by the two arrows in FIG. 5A, until the front of the header 22 engages and mates with the step 84 in the side wall. As the header assembly 20 is being pressed toward the side wall 14a, the flexible arms 66 of the header 22 contact and are deflected by the guide walls 78 of the housing 12. When the header 22 engages and Mates with the step 84 in the side wall 14a, the, enlarged end 68 of each flexible arm 66 snaps into a recess 86 formed in the adjacent guide wall 78.

The serrations or projections 70 on the enlarged end 68 of each flexible arm 66 are arranged at angle relative to the length of the flexible arm. Consequently, the extent to which each flexible arm 66 enters the recess 86 of the corresponding guide wall 78 is determined by the distance between the enlarged end 68 of the flexible arm and the front surface of the header 22 that engages the step 84 in the side wall 14a. The flexible arms 66 may thereby both adapt to differences in the foregoing distance that result from variations in the dimensions of the header 22 and housing 12 within manufacturing tolerances and also provide an ongoing outward bias on the header 22 to help ensure a tight fit between the header and the side wall 14a of the housing. The outward bias provided by the flexible arms 66 may also oppose a force applied when an external connector (not shown) is pressed against the-compliant pint 24 to attach the electronic assembly 10 to other vehicle circuitry (not shown).

To help ensure proper alignment between the compliant pins 24 of the header assembly 20 and the mating connector features of an external connector (not shown) that may connect the electronic assembly 10 to other vehicle circuitry (not shown), various datum surfaces may be provided on the housing 12, the header 22, and the compliant pins. Specifically, multiple parallel raised ribs 90 may be formed on the interior surface of the top 16 of the housing 12 to support a substantially flat bottom surface 88 (FIG. 6A) of the header 22. Substantially flat upper surfaces 92 of the raised ribs 90 may be precisely located relative to substantially flat surfaces 94 that define lower edges of the openings 80. The precise spacing between the substantially flat upper surfaces 92 of the raised ribs 90 and the substantially flat surfaces 94 in the side wall 14a of the housing 12 may help to ensure that the header 22 is precisely located relative to the housing in the vertical direction, as viewed in FIG. 5B. The precise spacing between the substantially flat upper surfaces 92 of the raised ribs 90 and other datum surfaces of the housing 12 may be achieved by having the portion of the plastic molding tool used to form the raised ribs 90 interface or engage directly with the portion of the plastic molding tool used to form the connector shroud 82.

Figure 5B:
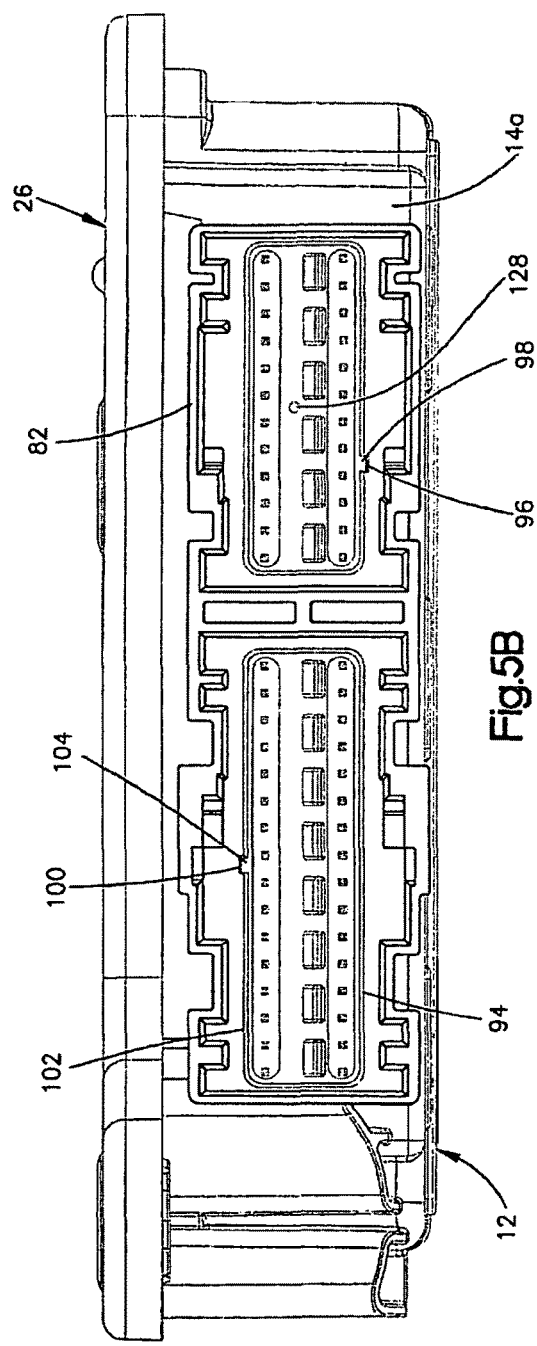
FIG. 5B is side view of a header assembly in a housing for the electronic assembly of FIG. 1.

To help locate the header 22 relative to the housing 12 in the horizontal direction, as viewed in FIG. 5B, a slot 96 may be precisely located in at least one of the substantially flat surfaces 94 in the side wall 14a of the housing to receive a corresponding, precisely located rib 98 formed in the header. A similar, precisely located slot 100 may be formed in one or both of two substantially flat upper surfaces 102 that partially define the openings 80 in the side wall 14a of the housing 12 to receive a similar, precisely located rib 104 in the header 22.

Figure 7A:
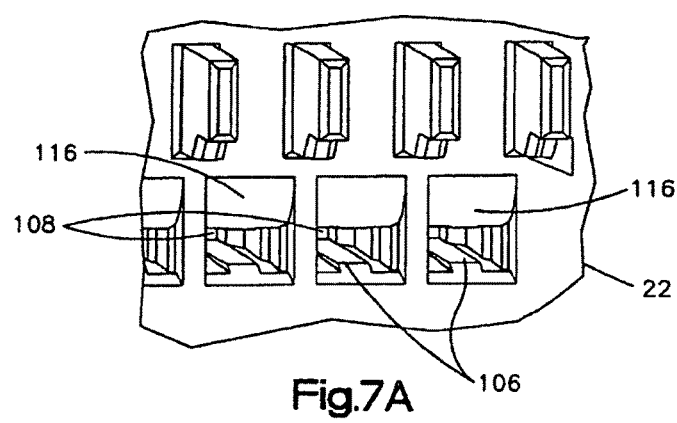
FIGS. 7A, 7B and 7C are enlarged views of portions of the header assembly of FIGS. 4A and 4B.
Figure 7B:
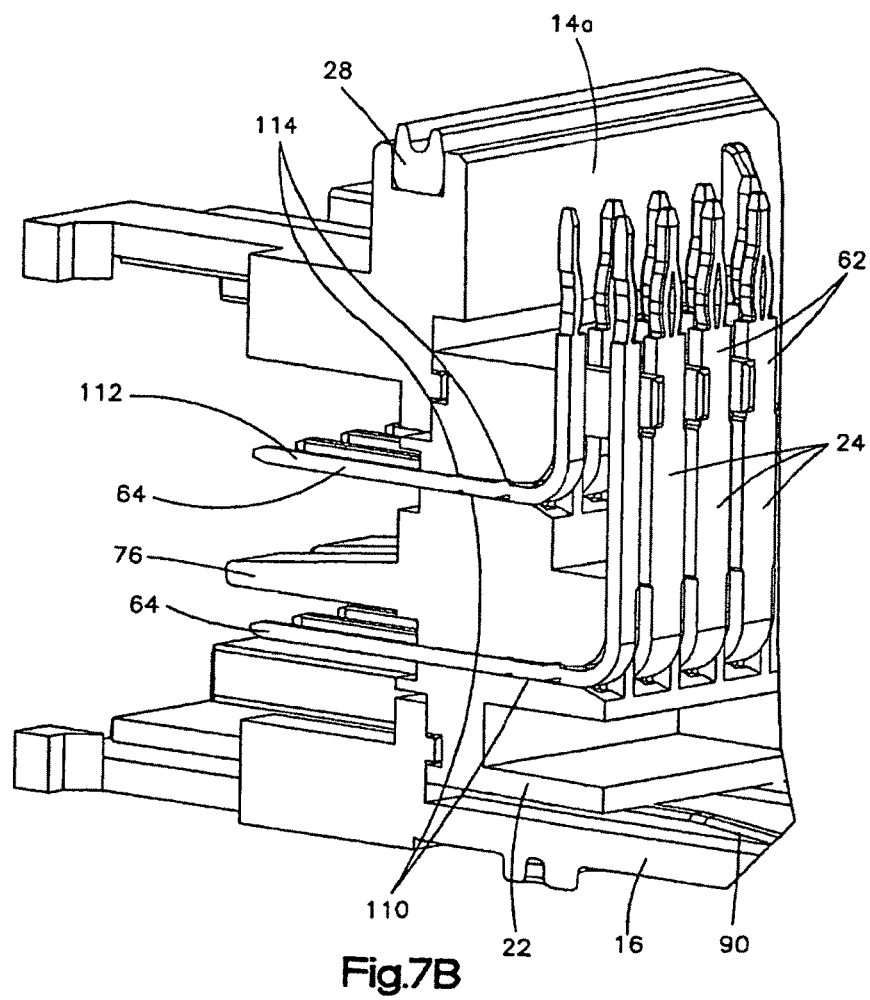

To help locate the compliant pins 24 precisely relative to the housing 12 and the opening 80 in the housing, a substantially flat passage datum surface 106 may be formed at the bottom (as viewed in FIG. 7A) of each pin-receiving passage 108 in the header 22. The substantially flat passage datum surface 106 may be precisely located relative to the substantially flat bottom surface 88 of the header 22. A corresponding substantially flat pin surface 110 may be formed on each compliant pin 24. When the compliant pins 24 are inserted into the passages 108, the substantially flat pin surfaces 110 are disposed immediately adjacent and overlying (as viewed in FIGS. 7A and 7B) the substantially flat passage datum surfaces 106.

To help ensure full engagement between the substantially flat pin surfaces 110 and the substantially flat passage datum surfaces 106, surfaces 112 of the compliant pins 24 that are opposed to the substantially flat pin surfaces 110 may be formed with raised portions 114. The raised portions 114 of the opposed surfaces 112 of the pins 24 engage passage surfaces 116 that are located opposite the substantially flat passage datum surfaces 106. Because the compliant pins 24 are made from resilient metal material, the raised portions 114 exert a downward bias on the compliant pins and press the substantially flat pin surfaces 110 against the substantially flat passage datum surfaces 106. The compliant pins 24 may thereby be precisely located relative to the substantially flat bottom surface 88 of the header 22, which may, in turn, be precisely located relative to the housing 12.

Figure 7C:
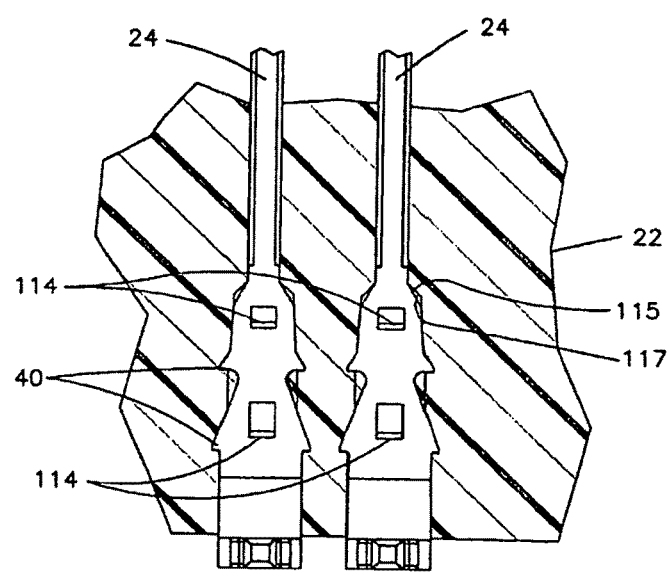

To help position the compliant pins 24 laterally in the pin receiving passages 108 of the header 22, each pin receiving passage and each compliant pin may have a laterally tapered configuration. More particularly, as shown in FIG. 7C, opposed passage side surfaces 115 of the header 22, which partially define the pin receiving passages 108, may be disposed at first angle relative to one another. Corresponding opposed side surfaces 117 of the compliant pins 24 may similarly be disposed at a second angle relative to one another. The second angle may be smaller than the first angle, the same as the first angle, or larger than the first angle. As a result, when the opposed side surfaces 117 of a compliant pin 24 engage the opposed passage side surfaces 115 that define a corresponding pin receiving passage 108 during insertion of the compliant pin in the pin receiving passage, the compliant pin will tend to be centered laterally in the pin receiving passage.

After the header assembly 20 is connected to the housing 12, the PCB 18 is positioned over the compliant pin legs 62 of the compliant pins 24, as shown in FIG. 1. The upwardly projecting compliant pin legs 62 of the compliant pins 24 extend into corresponding mating holes 118 in the PCB 18. The compliant pin legs 62 of the compliant pins 24 engage PCB surfaces that define the holes 118 and that may be plated or otherwise provided with electrically conductive material to provide an electrical connection between the compliant pins and the PCB 18. The cover 26 may then be placed over the open bottom of the housing 12 and secured in place using the metal screws 30.

Figure 8A:
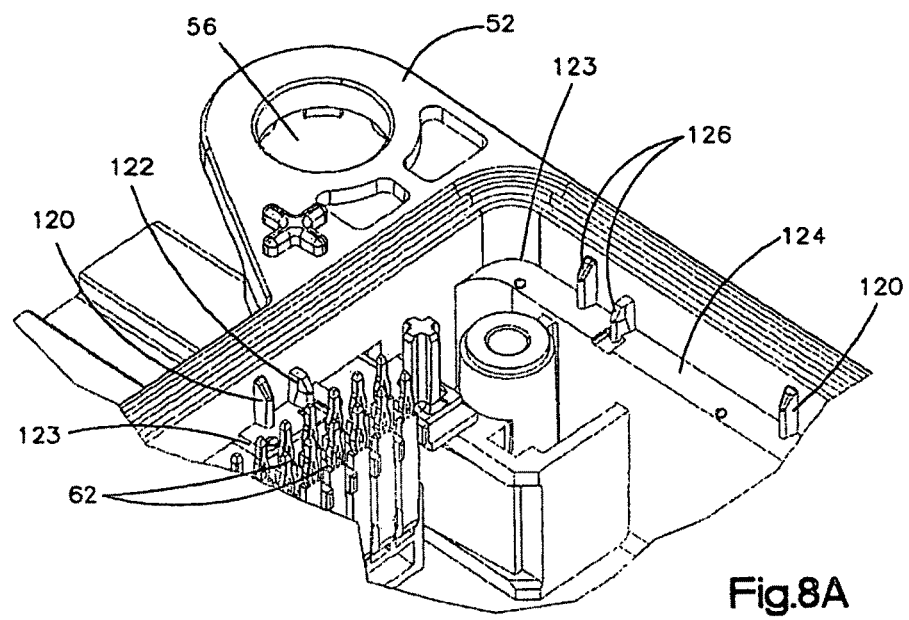
FIGS. 8A and 8B are enlarged views of portions of the housing of FIG. 5A.

As shown in FIGS. 1 and 8A, the interior of the housing 12 may be formed with support ribs 120 and guide ribs 122 that extend vertically along the sides of the housing and that are molded in one piece with the housing. The upper ends (as viewed in FIGS. 8A and 8B) of the support ribs 120 and guide ribs 122 are located adjacent the open bottom of the housing 12, while the lower ends of the support ribs and guide ribs are closely spaced to or merge into horizontal projections 123. The projections 123 may be formed as substantially horizontal lips or horizontally extending flanges molded in one piece with the housing 12 and provide flat support surfaces 124 adjacent the cover 26 for the housing. The flat support surfaces 124 support the PCB 18. The support surfaces 124 may also provide probing surfaces that are used as described in greater detail below. The upper ends of both the support ribs 120 and the guide ribs 122 may optionally include tapered gussets or angled surfaces 126 to help guide the PCB 18 into place on the support surfaces 124. The guide ribs 122 may also act as lateral crush ribs to accommodate manufacturing tolerances in the PCB 18 and the housing 12 while still maintaining the PCB tightly in place.

Figure 8B:
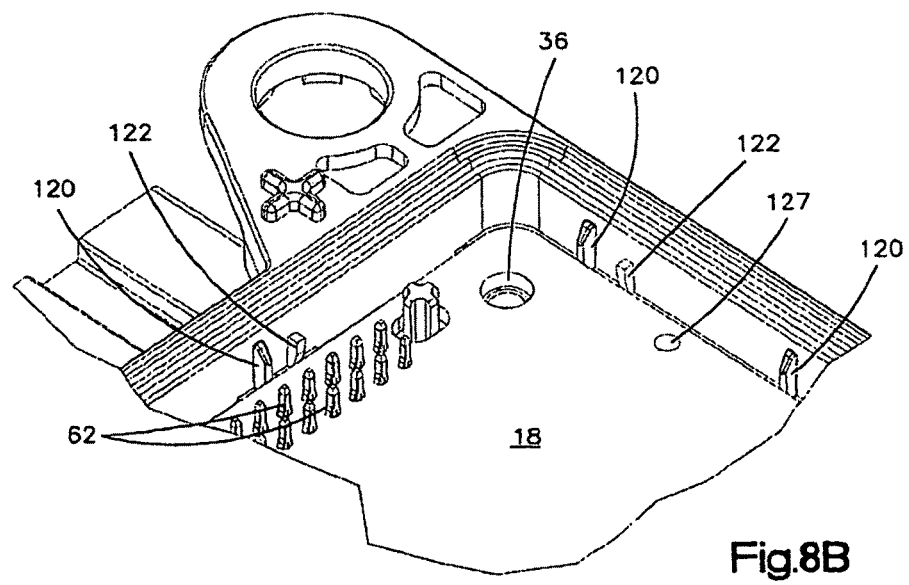

The PCB 18 may be formed with one or more holes 127, as shown in FIG. 8B, to permit a mechanical check to ensure that the PCB is properly seated on the support surfaces 124 formed on the support ribs 120. The check can be performed during the assembly process by having a probe (not shown)

automatically inserted into each hole 127 to check the distance between the top of the PCB 18 and the top of the underlying support surface 124.

As shown in FIG. 5B, the header 22 used in the compliant pin header assembly 20 may be formed with an optional hole 128 for leak testing. The hole 128 may have precise dimensions to provide a predetermined flow area. The predetermined flow area may be used to assess whether the completed electronic assembly 10 is properly sealed by applying a vacuum to the electronic assembly and measuring how long it takes to exhaust the air from the electronic assembly.

FIGS. 9A and 9B illustrate an optional capacitor carrier 130 for the electronic assembly 10. More specifically, as shown in FIG. 9A, the capacitor carrier 130 may be mounted to the top 16 of the housing 12 so that the capacitor carrier is located adjacent to the PCB 18 on a side of the PCB opposite the cover 26 or underneath the PCB (as viewed in FIG. 1). The capacitor carrier 130 has a tubular configuration and may be made of a plastic material. An elongated cylindrical capacitor 132 may be received in the capacitor carrier 130 through an open end of the capacitor carrier. Longitudinally extending ribs (not shown) may be formed on the interior surface of the capacitor carrier 130 to support the capacitor 132 in spaced relationship to a major portion of the interior surface of the capacitor carrier.

Terminals 134 may extend axially from an end of the capacitor 132 and engage adjacent ends of electrically conductive pins 136 pressed into openings (not shown) formed in an end portion 138 of the capacitor carrier 130. Compliant ends 140 of the conductive pins 136 project from the end portion 138 of the capacitor carrier 130 for engagement with the PCB 18, as will be described in further detail below. Two resilient plastic spring fingers 142 may be formed in one piece with the capacitor carrier 130 to apply a spring bias to the capacitor 132 to help hold it in place in the capacitor carrier. Although two spring fingers 142 are shown in FIG. 8C, any number of spring fingers may be used. The spring fingers 142 facilitate using the capacitor carrier 130 to support capacitors 132 of various lengths.

Support legs 144 may be disposed about the capacitor carrier 130 and may be molded in one piece with the capacitor carrier to help mount the capacitor carrier to the PCB 18. Each support leg 144 may receive a mounting pin 146 similar in construction to the electrically conductive pins 136, although the mounting pins need not be electrically conductive. Each mounting pin 146 has an enlarged end 148 and a compliant end 150 and generally tapers in width from the enlarged end to the compliant end. When each mounting pin 146 is inserted into an opening (not shown) in a support leg 144, the tapered shape of the mounting pin effectively causes the mounting pin to be wedged in place in the support leg with the compliant end 150 projecting from the support leg, as shown in FIG. 9A. The compliant ends 150 of the mounting pins 146 and the compliant ends 140 of the conductive pins 136 may be received in openings 152 in the PCB 18. The compliant ends 140 of the conductive pins may engage electrically conductive features (not shown) on the PCB 18, while the compliant ends 150 of the mounting pins 146 may engage non-conductive portions of the PCB to help hold the capacitor carrier 130 and the capacitor 132 in place.

Figure 10:
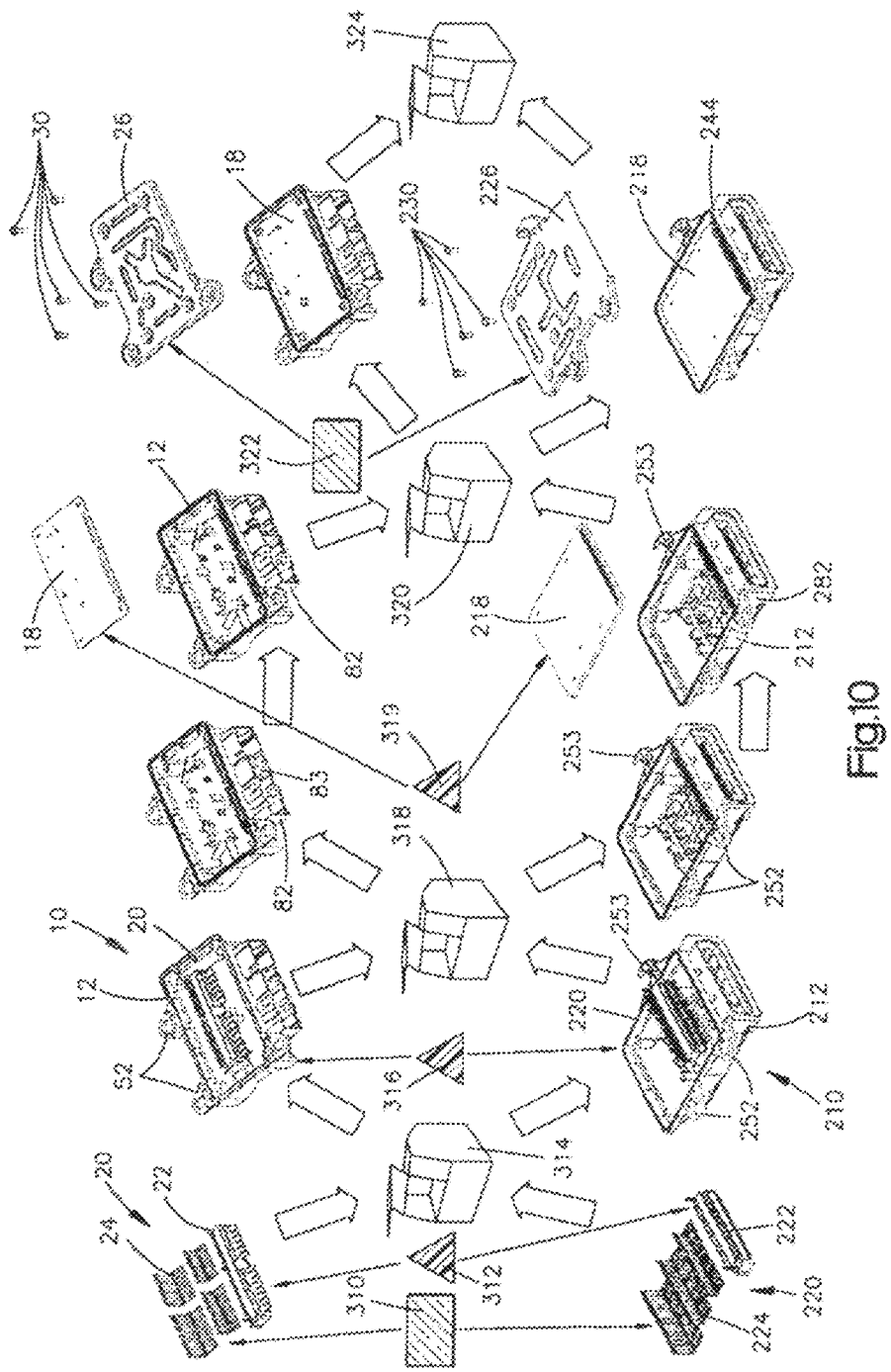
FIG. 10 is a schematic illustration of the method steps in accordance with one example process for manufacturing an electronic assembly in accordance with the present invention.

Referring to FIG. 10, a manufacturing method 300 in accordance with an example embodiment of the present invention is shown. The example manufacturing method 300 may be used to manufacture a plurality of different electronic assemblies, such as the electronic assembly 10 illustrated in FIGS. 1-3 and described above, and also air electronic assembly 210.

The electronic assembly 10 includes a housing 12, a compliant pin header assembly 20 formed of a header 22 and compliant pins 24, a PCB 18, a cover 26, and screws 30, all as described in detail above. The electronic assembly 210 similarly includes a housing 212, a compliant pin header assembly 220 formed of a header 222 and compliant pins 224, a PCB 218, a cover 226, and screws 230, which are similar to but different than the corresponding components of the electronic assembly 10. For example, the header assembly 20 of the electronic assembly 10 includes two rows of compliant pins 24, which are arranged in two spaced apart groups in each row. In contrast, the header assembly 220 of the electronic assembly 210 may include three rows of compliant pins 224 arranged without gaps or groups of compliant pins in each row and thus has at least one header assembly characteristic that is different from the corresponding characteristic of the header assembly 20. As an additional example, the housing 12 of the electronic assembly 10 has a connector shroud 82 with a divider 83 that divides the space surrounded by the connector shroud into two portions corresponding to the two groups of compliant pins 24. The housing. 12 also includes three outwardly projecting lugs 52. The housing 212 of the electronic assembly 210, on the other hand, may have a connector shroud 282 without any divider so that the space surrounded by the connector shroud is one continuous space. The housing 212 may also include two outwardly projecting lugs 252 and a hook 253. The housing 212 thus has housing characteristics that are different from the corresponding characteristics of the housing 12. As yet a further example, the PCB 18 has one configuration of holes 118 to receive the compliant pin legs 62 of the compliant pins 24, while the PCB 218 may have a different configuration of holes to receive the compliant pin legs of the compliant pins 224. The PCB 218 thus has at least one PCB characteristic that is different from the corresponding characteristic of the PCB 18.

The manufacturing method 300 uses common materials and common equipment to manufacture both the electronic assembly 10 and the electronic assembly 210. In particular, the manufacturing method 300 may begin with a common electrically conductive pin material 310, such as a metal, from which to manufacture both the compliant pins 24 and the compliant pins 224. The manufacturing method 300 may also include a common plastic header material 312 from which to form the plastic headers 22 and 222. After the compliant pins 24 and 224 and the headers 22 and 222 have been formed, a common pin insertion machine 314 may be used to insert the compliant pins 24 into the plastic header 22 and to insert the compliant pins 224 into the plastic header 222. The common pin insertion machine 314 may require one set of tooling (not shown) to grasp the compliant pins 24 and a second, set of tooling (not shown) to grasp the compliant pins 224, but the common pin insertion machine 314 may nonetheless be used to insert the compliant pins 24 and 224 into their corresponding headers 22 and 222, respectively. Thus, only a single pin insertion machine 314 may need be purchased and used to produce both the header assembly 20 and the header assembly 220. The common pin insertion machine 314 may thus be used to produce large quantities of compliant pin header assemblies 20 and compliant pin header assemblies 220 with different sizes of headers 22 and 222 and different numbers of compliant pins 24 and 224, thereby helping to reduce overall capital equipment investment cost and individual part costs.

Similarly, the manufacturing method 300 may include a common plastic housing material 316 from which to form the plastic housings 12 and 212. The manufacturing method may also include a common insert material (not shown) from which to form metal inserts, such as inserts 44, for the plastic housings 12 and 212. The manufacturing method may use a common insert pressing machine (not shown) to heat the metal inserts and press them into the housings 12 and 212 and a common header assembly insertion machine 318 to insert the header assemblies 20 and 220 into the plastic housings 12 and 212, respectively. The common header assembly insertion machine 318 may require one set of tooling (not shown) to grasp the header assembly 20 and a second set of tooling (not shown) to grasp the header assembly 220, but the common header assembly insertion machine may nonetheless be used to insert both header assemblies 20 and 220 into the respective plastic housings 12 and 212. Thus, only a single header assembly insertion machine 318 may need be purchased and used to insert both the header assembly 20 and the header assembly 220.

The manufacturing method 300 may also include a common PCB material 319 from which to form the PCBs 18 and 218. The manufacturing method 300 may use a common board-to-housing assembly machine 320 to mount the PCBs 18 and 218 on the compliant pins 24 and 224 of the header assemblies 20 and 220, respectively. The common board-to-housing assembly machine 320 may require one set of tooling (not shown) to grasp the PCB 18 and position the PCB 18 relative to the compliant pins 24 and a second set of tooling (not shown) to grasp the PCB 218 and position the PCB 218 relative to the compliant pins 224, but the common board-to-housing assembly machine 318 may nonetheless be used to mount both PCBs 18 and 218. Thus, only a single board-to-housing assembly machine 320 may need be purchased and used to mount both PCBs 18 and 218 on the compliant pins 24 and 224 of the header assemblies 20 and 220, respectively.

The manufacturing method 300 may further use a common electrically conductive cover material 322, such as a metal, from which to manufacture both the cover 26 and the cover 226. After the covers 26 and 226 are fabricated from the common cover material 322, the manufacturing method may further use a common screw insertion and tightening machine 324 to insert the screws 30 and 230 into the corresponding covers 26 and 226, respectively, and tighten the screws 30 and 230 in the corresponding threaded metal inserts 44 and 244. The common screw insertion and tightening machine 324 may require one set of tooling (not shown) to position the screws 30 relative to the cover 26 and a second set of tooling (not shown) to position the screws 230 relative to the cover 226, but the common screw insertion and tightening machine 324 may nonetheless be used to insert both sets of screws 30 and 230 into the covers 26 and 226, respectively. Thus, only a single screw insertion and tightening machine 324 may need to be purchased and used to insert both sets of screws 30 and 230.

From the above description of the invention, those skilled in the art will perceive improvements, changes and modifications. Such improvements, changes and modifications within the skill of the art are intended to be covered by the appended claims.

Having described the invention, the following is claimed:

1. A method of manufacturing different electronic devices using common equipment, said method comprising the steps of:
    forming a first compliant pin header assembly that includes a first header and a first plurality of compliant pins;
    engaging the first compliant pin header assembly with a first housing using a common header-to-housing assembly machine so that a first end of each compliant pin of the first plurality of compliant pins is presented outwardly of the first housing and a second end of each compliant pin of the first plurality of compliant pins is disposed within the first housing;
    placing a first printed circuit board within the first housing using a common board-to-housing assembly machine so that the first printed circuit board engages the second end of each compliant pin of the first plurality of compliant pins;
    forming a second compliant pin header assembly that includes a second header and a second plurality of compliant pins;
    engaging the second compliant pin header assembly with a second housing using the common header-to-housing assembly machine so that a first end of each compliant pin of the second plurality of compliant pins is presented outwardly of the second housing and a second end of each compliant pin of the second plurality of compliant pins is disposed within the second housing, the second housing having a different housing characteristic than the first housing; and
    placing a second printed circuit board within the second housing using the common board-to-housing assembly machine so that the second printed circuit board engages the second end of each compliant pin of the second plurality of compliant pins, the second printed circuit board having a different circuit board characteristic than the first printed circuit board.

2. The method of claim 1 wherein said step of forming a first compliant pin header assembly includes the steps of:
    molding the first header from a common plastic header material to form passages in the first header to receive the compliant pins of the first plurality of compliant pins;
    forming the first plurality of compliant pins from a common electrically conductive pin material; and
    inserting each compliant pin of the first plurality of compliant pins into a corresponding passage of the first header using a common insertion machine to form the first compliant pin header assembly.

3. The method of claim 2 wherein said step of forming a second compliant pin header assembly includes the steps of:
    molding the second header from the common plastic header material to form passages in the second header to receive the compliant pins of the second plurality of compliant pins;
    forming the second plurality of compliant pins from the common electrically conductive pin material; and
    inserting each compliant pin of the second plurality of compliant pins into a corresponding passage of the second header using the common insertion machine to form the second compliant pin header assembly.

4. The method of claim 1 further comprising the steps of:
    molding the first housing from a common plastic housing material; and
    molding the second housing from the common plastic housing material.

5. The method of claim 1 further comprising the steps of:
    forming a first cover for the first electronic device from a common metal cover material; and
    forming a second cover for the second electronic device from the common metal cover material.

6. The method of claim 5 further comprising the steps of:
    assembling the first cover to the first housing using a common cover-to-housing assembly machine so that the first cover engages an electrical contact formed on the first printed circuit board at a location spaced from an outer peripheral area of the first printed circuit board to provide a first electrical grounding path from the first printed circuit board to the first cover; and assembling the second cover to the second housing using the common cover-to-housing assembly machine so that the second cover engages an electrical contact formed on the second printed circuit board at a location spaced from an outer peripheral area of the second printed circuit board to provide a second electrical grounding path from the second printed circuit board to the second cover.

* * * * *